(12) United States Patent
Yamagata

(10) Patent No.: US 6,653,209 B1
(45) Date of Patent: Nov. 25, 2003

(54) METHOD OF PRODUCING SILICON THIN FILM, METHOD OF CONSTRUCTING SOI SUBSTRATE AND SEMICONDUCTOR DEVICE

(75) Inventor: Kenji Yamagata, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 199 days.

(21) Appl. No.: 09/671,857

(22) Filed: Sep. 28, 2000

(30) Foreign Application Priority Data

Sep. 30, 1999 (JP) ............................................. 11-278937

(51) Int. Cl.⁷ .......................... H01L 21/46; H01L 21/20
(52) U.S. Cl. ........................ 438/459; 438/455; 438/480
(58) Field of Search ................................. 438/753, 459, 438/455, 458, 480; 117/97, 2

(56) References Cited

U.S. PATENT DOCUMENTS

| | | | |
|---|---|---|---|
| 5,371,037 A | 12/1994 | Yonehara | 437/86 |
| 5,374,564 A | 12/1994 | Bruel | 437/24 |
| 5,750,000 A | 5/1998 | Yonehara et al. | 156/630.1 |
| 5,767,020 A | 6/1998 | Sakaguchi et al. | 438/705 |
| 5,856,229 A | 1/1999 | Sakaguchi et al. | 438/406 |
| 5,863,830 A | 1/1999 | Bruel et al. | 438/478 |
| 5,869,387 A | 2/1999 | Sato et al. | 438/459 |
| 5,980,633 A * | 11/1999 | Yamagata et al. | 117/94 |
| 6,008,110 A * | 12/1999 | Samata et al. | 438/459 |
| 6,066,529 A * | 5/2000 | Lin et al. | 438/171 |
| 6,121,117 A | 9/2000 | Sato et al. | 438/459 |
| 6,136,684 A | 10/2000 | Sato et al. | 438/624 |
| 6,180,497 B1 * | 1/2001 | Sato et al. | 438/458 |
| 6,350,702 B2 * | 2/2002 | Sakaguchi et al. | 438/406 |
| 6,380,099 B2 * | 4/2002 | Sakaguchi et al. | 216/33 |
| 6,410,436 B2 * | 6/2002 | Yamagata et al. | 438/455 |
| 6,433,615 B2 * | 8/2002 | Nagano et al. | 327/513 |
| 2002/0109144 A1 * | 8/2002 | Yamazaki | 257/72 |

FOREIGN PATENT DOCUMENTS

| | | |
|---|---|---|
| EP | 0 553 859 | 8/1993 |
| EP | 0 843 344 | 5/1998 |
| EP | 0 867 917 | 9/1998 |
| EP | 0 975012 A2 * | 1/2000 |
| JP | 5-21338 | 1/1993 |
| JP | 5-218053 | 8/1993 |
| JP | 7-302889 | 11/1995 |
| JP | 2608351 | 2/1997 |
| JP | 9-100197 | 4/1997 |
| WO | 98/52216 | 11/1998 |

* cited by examiner

Primary Examiner—Michael Trinh
(74) Attorney, Agent, or Firm—Fitzpatrick, Cella, Harper & Scinto (57) ABSTRACT

To decrease the thickness of a silicon thin film to a desired value without deterioration of the quality thereof while avoiding the surface roughness due to speed increasing oxidation of crystal defect portions occurring when conducting the conventional sacrificial oxidation, effect of dust particles, etc. and also avoiding deterioration of high pressure resistance of the oxide film associated with the surface roughness. A silicon ultrathin film SOI layer is produced in the following two steps: preparing a SOI wafer having a silicon thin film, which exhibits less precipitation of oxygen, thereon by the SIMOX method or the semiconductor bonding method, and cleaning the SOI wafer with an alkali solution such as SC1 and TMAH, so as to utilize the etching action of the aqueous cleaner.

17 Claims, 8 Drawing Sheets

METHOD OF PRODUCING SILICON THIN FILM, METHOD OF CONSTRUCTING SOI SUBSTRATE AND SEMICONDUCTOR DEVICE

BACKGROUND OF THE INVENTION

1. Field of the Invention

The present invention relates to a method of producing a silicon thin film, in particular, to a method of controlling the thickness of a silicon thin film used in a SOI wafer etc. and of producing a silicon thin film. More particularly, the present invention relates to production of a silicon thin film of any desired thickness by decreasing the thickness of the silicon thin film through wet-cleaning.

2. Related Background Art

There are known the SIMOX (Separation by IMplantation of OXygen) method, the semiconductor bonding method and so forth as a method of producing a SOI wafer.

The SIMOX method uses a technique for forming a silicon oxide layer in a silicon substrate by implanting oxygen ions into the silicon substrate from its surface and then annealing the resultant substrate at a high temperature to form the silicon oxide layer at the portion where the oxygen ions have been implanted. In this method, the energy for implanting oxygen ions and the dose of the same cannot be set arbitrarily, but they are fixed to approximately constant conditions. Accordingly, it is difficult to set arbitrarily the thickness of the silicon film or that of the oxide film formed by ion implantation in the production of a SOI wafer.

On the other hand, there are several types of semiconductor bonding method. The first one is referred to as "bonding and polishing SOI" method.

In the "bonding and polishing SOI" method, two silicon wafers at least one of which has been oxidized, are previously prepared, bonded to each other at room temperature and annealed, and then polished from its one side, to leave a silicon film of a desired thickness on the silicon oxide layer. According to this method, both the thickness of the silicon layer and that of the implanted oxide layer can be set arbitrarily. In this method, however, as means of making a thin film of a silicon layer are solely used grinding and polishing. Accordingly, it is difficult to obtain a thin film of a uniform several hundred nm thickness because the limitations of the original thickness accuracy and polishing accuracy in the silicon wafer.

As the measures to overcome the above difficulty, a technique for forming an ultrathin film (100 nm thick or less) uniformly in which thickness distribution of a SOI film is measured instantly and dry-etching is performed relatively heavily at regions where the film is rather thick while dry-etching is performed relatively lightly at regions where the film is rather thin has been reported. This technique is referred to as PACE (Plasma Assisted Chemical Etching). The PACE system includes two units separated from each other: a unit for measuring instantly thickness of a SOI film at in-plane multiple points (10000 points or more) and a unit for performing plasma etching. The unit for performing etching has a plasma generating portion in the form of a nozzle and is designed in such a manner that the nozzle can move over a wafer along its surface and generate plasma according to the measurements of the thickness of the SOI layer so as to etch, for example, the rather thick regions relatively heavily. This technique allows the control of the etching amount from region to region within the wafer surface and hence the control of the absolute value and uniformity of the film thickness. However, the surface having been subjected to plasma-assisted etching has etching damage remaining thereon; accordingly, in many cases, the surface of the SOI layer is subjected to polishing so as to remove its damaged layer. This polishing operation may cause non-uniformity again in the film thickness of the SOI layer which has just been made uniform.

In another type of semiconductor bonding method, as disclosed in U.S. Pat. No. 5,374,564, a SOI structure is produced in the following three steps: implanting hydrogen ions in a silicon wafer having an oxide film formed thereon from its surface to form a brittle layer inside the wafer, bonding the wafer to another wafer, and heat-treating this bonded wafer or spraying a fluid (a liquid such as water or a gas such as nitrogen) on the side of this bonded wafer to separate the brittle layer.

In this method, the film thickness can be controlled by the thickness of the oxide film of the wafer prepared at the beginning and the energy for implanting hydrogen ions. However, in many cases, polishing is required as a finishing operation to the roughness of the separated SOI surface, which may cause again non-uniformity in the film thickness of SOI layer.

In still another type of semiconductor bonding method, as disclosed in U.S. Pat. No. 5,371,037 (Japanese Patent No. 2,608,351), Japanese Patent Application Laid-Open No. 5-21338 or Japanese Patent Application Laid-Open No. 7-302889, a SOI layer is produced in the following two steps: bonding an epitaxial silicon single crystal film grown on a substrate having a porous silicon thereon to another wafer via an oxide film and removing unnecessary portions. In this method, the thickness of the SOI layer is controlled through controlling the thickness of the epitaxial film and that of the oxide film.

In the step of selectively etching the porous silicon remaining on the surface of the SOI layer, the surface may become rough, as seen from the observation after completing the step; however, the rough surface can be changed into a very smooth surface by hydrogen annealing the surface of the SOI layer, as disclosed in Japanese Patent Application Laid-Open No. 5-218053. This method does not permit the deterioration of thickness distribution of the SOI layer to occur.

However, even in this method, it is not easy to form an ultrathin film with thickness 100 nm or smaller.

In the PACE method, the layer damaged by the plasma assisted etching and remaining on the surface of a SOI layer is removed; therefore the SOI layer must be formed to a little larger thickness allowing a little thickness for removing. However, the damaged layer is removed by polishing, thereby variations occur in film thickness distribution, which makes it difficult to form a uniform ultrathin film. For the same reason, in every and each method in which a SOI layer requires polishing, it is difficult to directly form an ultrathin film.

In the cases where the hydrogen annealing described above is adopted to smooth a SOI film, pinholes may be created. Microregions on the semiconductor bonding interface side of an ultrathin film can be stressed due to dust particles, which are too fine to measure with measuring instruments (90 nm or smaller), existing at the semiconductor bonding interface and due to surface irregularities of the wafer itself. If hydrogen annealing is performed in the presence of this stress, pinholes can be created at the portions the stress is established.

Meanwhile, when thickness of a SOI film required in designing a semiconductor device, such as transistor, is much thinner than the least possible thickness which can be supplied as a SOI wafer, or when SOI wafers of different thickness are required with change in design, supply of wafers cannot fully keep up with the demands.

In such a case, in order to obtain a SOI layer having a desired film thickness, manufacturers of semiconductor devices have to take the steps of: getting previously a SOI wafer having a SOI layer thicker than the designed one and subjecting the SOI layer to sacrificial oxidation in which the surface of the SOI layer is once subjected to thermal oxidation and then the oxidized portions are removed by etching.

However, performing sacrificial oxidation causes speed increasing oxidation the crystal defects existing in the SOI film and inhibits oxidation in the vicinity of the regions on which dust particles are deposited; as a result, surface roughness is caused on the surface of the SOI layer. This in turn causes deterioration of high pressure resistance of the oxide film in semiconductor devices.

SUMMARY OF THE INVENTION

Accordingly, the object of the present invention is to provide a method for controlling the thickness of a silicon thin film, a method of producing a silicon thin film and a method of constructing a SOI substrate which enable the thickness of a silicon thin film to be decreased to a desired value without deterioration of the quality of the silicon thin film.

The present invention is a method for producing a silicon thin film provided on an insulating surface, the method being characterized by comprising a step of wet-cleaning the silicon thin film on the insulating surface to decrease the thickness of the silicon thin film to 100 nm or smaller.

Further, the method for producing a silicon thin film is characterized in that a first thickness of the silicon thin film, which means the thickness before it is subjected to the wet-cleaning, is larger than 100 nm and the wet-cleaning is performed after the silicon thin film with the first thickness is heat-treated in the reducing atmosphere containing hydrogen and until the thickness of the silicon thin film is decreased to a second thickness smaller than the first one, the second thickness being 100 nm or smaller or 50 nm or smaller.

The method for fabricating a SOI substrate according to the present invention is characterized by comprising the steps of: preparing a substrate having a silicon thin film with a first thickness larger than 100 nm on an insulating surface; heat-treating the substrate in the reducing atmosphere containing hydrogen, and wet-cleaning the heat-treated substrate to decrease the thickness of the silicon thin film to a second thickness smaller than the first thickness, the substrate being prepared in the following steps of: forming a composite member by bonding a first substrate, which includes a silicon thin film formed on a porous layer, to a second substrate in a manner that an insulating layer exists between the first substrate and the second one and dividing the composite member at the porous layer, or the substrate being prepared in the following steps of: forming a composite member by bonding a first substrate, which includes an ion implanted layer and a silicon thin film formed thereon, to a second substrate via an insulating layer and dividing the composite member at the ion implanted layer.

According to the present invention, it is possible to avoid the surface roughness due to the speed increasing oxidation of crystal defect portions occurring when conducting the conventional sacrificial oxidation, the effect of the dust particles, etc. and also avoid deterioration of the high pressure resistance of the oxide film which is attendant on the surface roughness. In addition, according to the present invention, it is possible to omit the steps of thermal oxidation and of etching the oxide film formed by thermal oxidation.

DESCRIPTION OF THE PREFERRED EMBODIMENTS

Figure 1A:
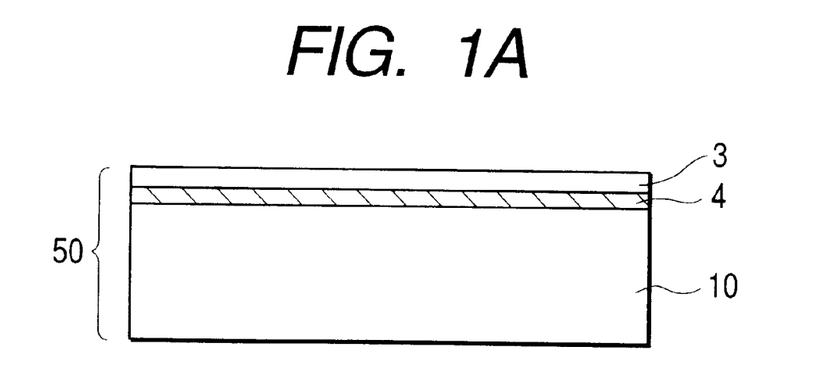
FIGS. 1A and 1B are schematic views illustrating the present invention.
Figure 1B:
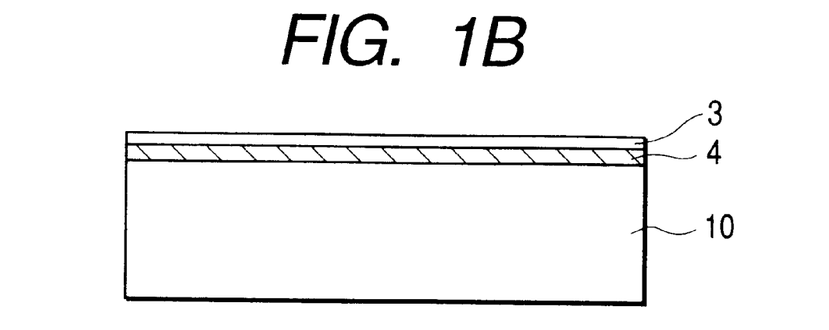

In the present invention, first a SOI substrate 50 as shown in FIG. 1A is prepared, and then a silicon thin film (a SOI layer) 3 on an insulating layer 4 of the SOI substrate is subjected to wet-cleaning in such a manner as not to subject the same to thermal oxidation. This wet-cleaning allows the thickness of the SOI layer to be decreased, thereby a desired thickness is obtained (FIG. 1B). In the figures, reference numeral 10 denotes a substrate made of silicon etc.

The SOI layer used in the present invention is preferably that of the SOI wafer constructed by the SIMOX method or the semiconductor bonding method. The SOI layer constructed using a silicon thin film formed by the epitaxial growth or the hydrogen anneal, or the SOI layer constructed using a silicon substrate formed by the FZ (floating zone melting) method is more preferable than a silicon wafer constructed by the CZ (Czochralski) method, a popular method, because the oxygen content of the SOI formed by any one of the first three methods is lower than that of the SOI formed by the last method. The SOI layer of MCZ wafer is also preferable. The SOI layer obtained in the above described manner has less precipitate, and it is a uniform silicon thin film. The substrate for supporting the silicon thin film is a semiconductor or insulator substrate having an insulating film formed on its surface or an insulator substrate.

The reason is that, if substances other than silicon precipitate in the silicon thin film, uniform oxidation and uniform etching are obstructed at the portion where the substances precipitate.

When using a silicon wafer obtained by the CZ (Czochralski) method as a SOI layer, oxygen precipitates, which permits defects to occur in the silicon and roughness to occur on the surface of the SOI layer. Oxygen, which is contained much in CZ silicon wafer, is reduced by hydrogen, thereby its content becomes low and its precipitation becomes inhibited. Accordingly, hydrogen annealed SOI layers may include the type constructed by first forming a SOI layer on a wafer without hydrogen annealing operation and then subjecting the SOI layer to hydrogen annealing and the type constructed by using a silicon wafer previously hydrogen annealed.

The thickness of the SOI layer before it is decreased according to the present invention is 100 nm or larger and the SOI layer obtained finally is a very thin film of as thin as less than 100 nm.

The aqueous cleaner used in the present invention is preferably a SC1 aqueous cleaner used in cleaning known as RCA cleaning. The SC1 aqueous cleaner consists of the mixture of $NH_4OH$, $H_2O_2$ and $H_2O$. The typical mixing ratio of standard ammonia water to an aqueous solution of hydrogen peroxide to water varies, for example, 1:5:5, 1:10:10, 0.05:1:5, 0.05:1:10, etc. and it may be in the range of 2:5:5 to 0.01:1:5. An ammonia water with a concentration of 29% and an aqueous hydrogen peroxide with a concentration of 31% can be used in the aqueous cleaner herein described.

In the cleaning according to the present invention, the higher the temperature of the aqueous cleaner is, the higher the ability to clean and etch is. The temperature of the aqueous cleaner is generally preferably 60° C. or higher, more preferably 60° C. to 95° C.

In addition, organic alkali solutions generally have the ability to etch silicon. For example, TMAH (tetramethylammonium hydroxide), which is widely used as a developing solution of photoresist in the photolithography process of a semiconductor device production line, is also effective as an aqueous cleaner used in the present invention.

The etchants for silicon can include the mixture of hydrofluoric acid and nitric acid; however, this system may etch crystal defects selectively and permit the SOI surface to be rough. Thus care should be taken when using this system.

EXAMPLES

First Example

With reference to FIGS. 2A to 2I and FIG. 3, an example of the present invention will be described.

FIGS. 2A to 2I are schematic views for explaining a fabricating process of an SOI wafer utilizing a porous layer and an epitaxial growth layer. FIG. 3 is a schematic view showing an anodizing apparatus. In FIG. 3, reference numeral 102 denotes an anodizing tank, reference numeral 103 denotes a substrate holder, reference numeral 105 denotes an opening of the substrate holder, reference numeral 104 denotes a suction pad under reduced pressure, reference numeral 106 an electrolytic solution for anodization, reference numerals 107 and 108 denote electrode terminals to supply currents for anodization, and reference numeral 109 denotes a decompressing line.

Figure 2A:
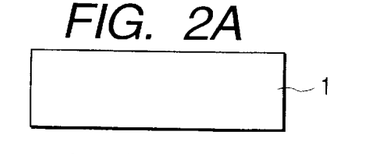
FIGS. 2A, 2B, 2C, 2D, 2E, 2F, 2G, 2H and 2I are schematic views illustrating a method of producing a silicon thin film in accordance with one form of the present invention.
Figure 3:
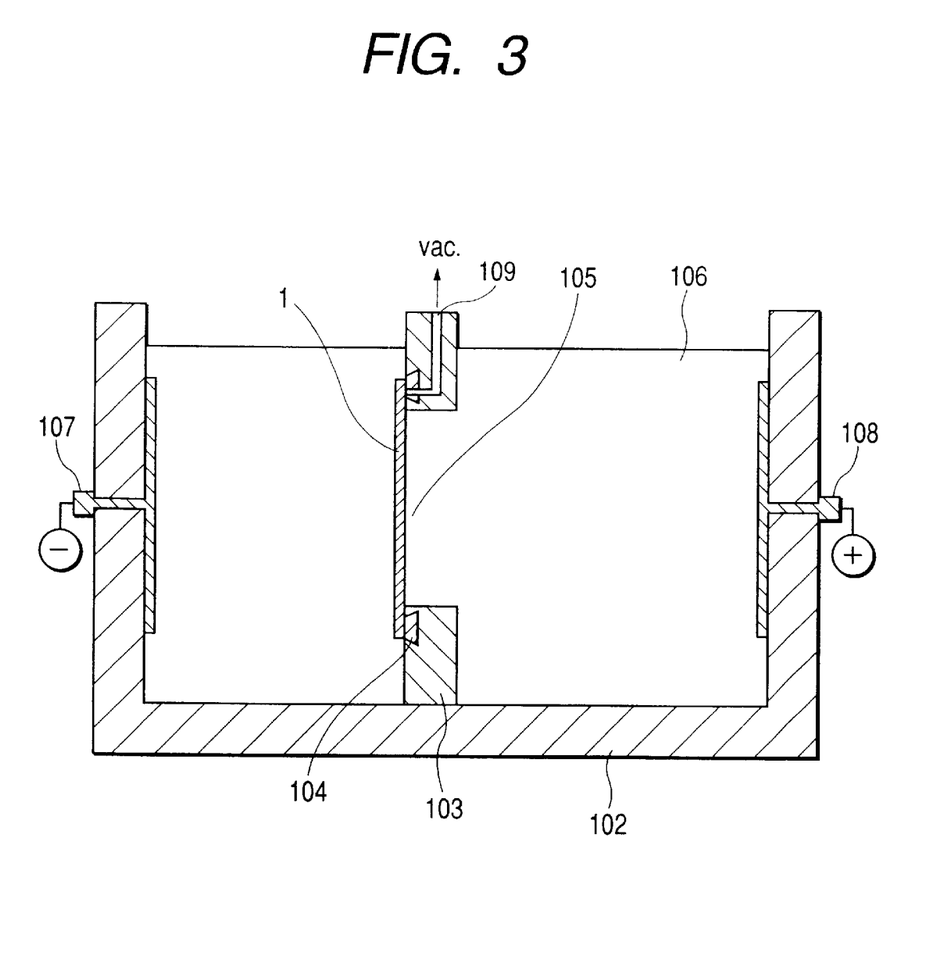
FIG. 3 is a schematic view showing an anodic chemical treatment unit.

At first, as a silicon substrate 1, an 8 inch p-type device wafer with specific resistance of 0.015 Ωcm was prepared (FIG. 2A).

The device wafer 1 was fixed in the manner that the suction pad 104 of the holder 103 disposed in the anodizing tank 102 was brought into contact with a rear surface of the device wafer 1, and was subjected to a reduced pressure introduced by the decompressing line 109 communicated with a (not shown) suction groove of the pad 104, to be fixed.

In this condition, the tank 102 was filled with a mixed solution of hydrofluoric acid:ethanol=2:1 as the electrolytic solution.

Figure 2B:
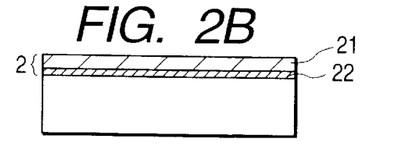

Next, current of a first current value (2.5 ampere) for 5 minutes, and then current of a second current value (7.2 ampere) for one minute were caused to flow between a negative electrode 107 and a positive electrode 108 made of platinum disposed at the both ends of the anodizing tank. As a result thereof, a portion from the front surface of the device wafer 1 to the depth of 5 μm became a first porous silicon layer 21, moreover a portion to the depth of 2 μm became a second porous silicon layer 22 more porous and thinner than the first porous silicon layer, and thus a porous layer 2 comprising a plurality of porous substance mutually different in porosity was formed (FIG. 2B).

Figure 2C:
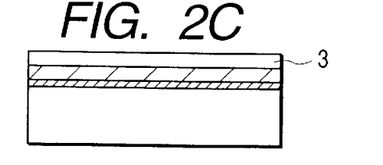

Next, at 400° C. heat oxidation was performed so that a thin oxide film was formed on the surfaces of pore walls of the first and second porous layers 2. After the cleaning with rare hydrofluoric acid, the device wafer was disposed in a CVD device and the temperature was raised, hydrogen gas flowing, to carry out the hydrogen baking of porous layer 2. Subsequently, dichlorosilane ($SiH_2Cl_2$) together with the hydrogen carrier gas was let to flow and a front surface of the first porous layer 2 was subjected to epitaxial growth at 1050° C. so that a 150 nm non-porous single crystal silicon film 3 (SOI layer) was formed (FIG. 2C).

Figure 2D:
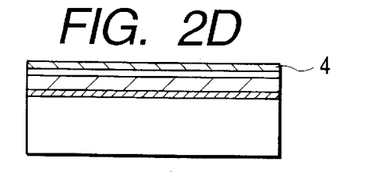
Figure 2E:
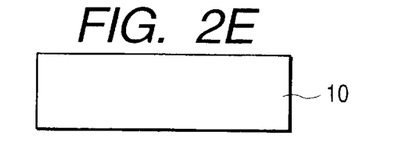

Subsequently, a surface of the single crystal silicon film 3 was subjected to heat oxidation so that a 100 nm silicon oxide layer 4 was formed (FIG. 2D). Forming of this silicon oxide layer can be omitted.

Figure 2F:
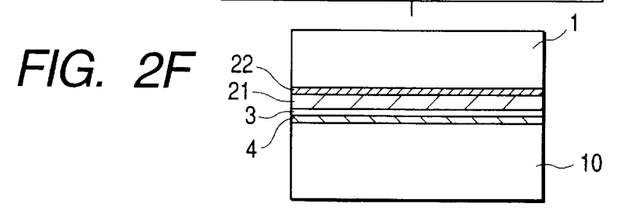

After cleaning a handle wafer 10 which had been prepared separately, the wafer was bonded onto the silicon oxide layer of the device wafer at a room temperature in a clean atmosphere (FIG. 2F). Incidentally, when SOI layer 3 of device wafer 1 (or silicon oxide layer 4 formed thereon) and handle wafer 10 are bonded, the device wafer may be a silicon substrate, or may have an insulating film on a silicon substrate comprised of the handle wafer, or may be a light-transmissive substrate or an insulating film.

Figure 2G:
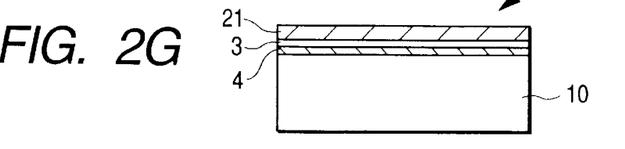
Figure 2H:
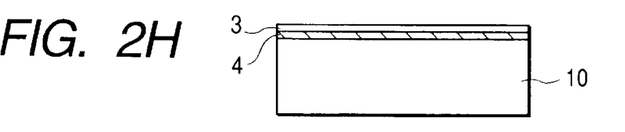
Figure 2I:
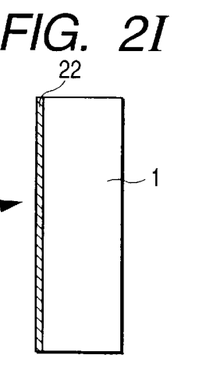

After this bonded wafer (a multiplayer structure) was heat-treated in a nitrogen atmosphere of 1100° C. for two hours, a wedge was inserted from a side surface of the wafer into the bonded surface so that the two porous silicon layers 21 and 22 were separated approximately along their surface (FIGS. 2G and 2I).

Thus, a wafer in which silicon oxide layer 4 and single crystal silicon film 3 were transferred to handle wafer 10 was obtained. A porous silicon layer 21 was left on the surface of single crystal silicon film 3 (FIG. 2G).

Next, for about 90 minutes, the obtained wafer was immersed in a mixed solution of hydrofluoric acid:an aqueous solution of hydrogen peroxide:water=1:20:50 with ultrasonic waves being applied so that the porous silicon layer 21 was removed by selective etching.

In order to smooth the surface of this wafer, hydrogen annealing was performed at 1100° C. for an hour to obtain an SOI wafer comprising a 100 nm silicon layer and the 100 nm buried silicon oxide layer (FIG. 2H).

Subsequently, in order to further thinly control the thickness of the single crystal silicon film (SOI layer) 3 of the obtained SOI wafer, the SOI wafer was immersed in an SC1 solution having a composition in volume of ammonia water:an aqueous solution of hydrogen peroxide:water= 0.05:1:10 at 85° C. for cleaning. Etching rate of this cleaning step was 0.5 nm/min, and the cleaning continued for 140 minutes. As a result, 70 nm of SOI layer 103 was subjected to etching and was removed. Incidentally, concentrations of aqueous ammonia and the aqueous solution of hydrogen peroxide are respectively 29% and 31%.

Consequently, an ultra thin film SOI wafer having 30 nm thickness for the SOI layer and 100 nm thickness for the buried silicon oxide layer was obtained.

Observation of the surface of the obtained SOI wafer revealed that it was an extremely flat and smooth and was a uniform surface which was almost the same as that immediately after hydrogen annealing treatment.

<Comparative Experiment 1>

A comparative experiment was conducted to compare the case where sacrificial oxidation is preformed for thin film processing with the case where thin film processing is preformed after cleaning as in the present invention.

In particular, besides an SOI wafer (test sample A) which as described above was subjected to etching 70 nm in film thickness by cleaning with the above described mixed solution of ammonia water/the aqueous solution of hydrogen peroxide/water, an SOI wafer (test sample B) was prepared of which a portion of approximately 150 nm of the SOI layer was subjected to oxidation by heat oxidation, thereafter that oxide film was subjected to etching with dilute fluoric acid, resulting in SOI film thickness reduction of approximately 70 nm.

In order to conduct comparison on surface nature of the SOI layers, the both samples was subjected to immersion in concentrated fluoric acid for 15 minutes, and thereafter their surfaces were observed with a microscope.

As a result thereof, in test sample B, a void having a diameter of approximately 50 μm (a gap below an SOI film that is formed due to defects in an SOI layer or since fluoric acid goes through through-holes and subsequently a buried oxide film undergoes etching with fluoric acid: so-called HF void) was observed with intensity of approximately 5 voids/cm$^2$. On the other hand, in test sample A, a density of so-called HF void stayed not more than 0.05 void/cm$^2$.

The density of HF void of test sample B, that is, the wafer subject to heat oxidation, was guessed to become high since crystal defects included in the SOI was subjected to oxidation in an enhanced manner in an oxidation step, that portion was subjected to etching to become extremely thin when it was dipped in the HF solution to make pores in the SOI portion, and it became so easy for HF void to be formed.

<Comparative Experiment 2>

For deciding the order of the above described "etching of porous silicon (1)," "hydrogen annealing (2)," and "film thickness reduction by cleaning (3)," an experiment to be described as follows was conducted for decision making. The above described steps were conducted in an order of (1), (3), and (2), (that is, this eventually resulted in making the SOI film get thin and implementing flattening by hydrogen annealing) and as a result of this implementation, microscopic observation was conducted to a wafer surface after hydrogen annealing and a number of things deemed to be quadrilateral pits were observed. This is deemed that heat stress of annealing influenced an extremely thin 30 nm silicon film, more intensive stress was concentrated to portions having crystal defects or portions which were locally thin, and therefore pores were created in the film under the atmosphere for annealing. Once the pores get opened, the boundary between silicon and the silicon oxide film is exposed, which brings about a reaction of $Si+SiO_2 \rightarrow 2SiO$ in hydrogenic atmosphere and causes the silicon and the silicon oxide film to evaporate to enlarge pores.

This reason lead to a discovery that for producing a thin film SOI layer an SOI needed to be comparatively thick to undergo annealing, resulting in the present invention involving a thin film processing in an order of (1), (2), and (3).

In t he case where an SOI layer undergoes hydrogen annealing, film thickness is preferably not less than 70 nm, and more preferably not less than 100 nm at that point of time. A case that the buried oxide layer is sufficiently thick, however, does not apply to the above case. For example, if the buried oxide layer is about 500 nm in thickness, the SOI layer before hydrogen annealed may be about 50 nm in thickness. If the buried oxide layer is about 100 nm in thickness, then it is to be desired that the SOI layer is 70 nm or more in thickness.

(Forming of Porous Layer)

A porous layer can be formed on a wafer surface by anodic chemical treatment processing, and with kinds or densities in current density or chemical solution, porous layers of two layers or not less than three layers mutually different in porosity can be formed.

Among others, a porous layer is preferably configured by having a first porous layer having a first porosity and a second porous layer having a second porosity larger than the above described first porosity in an order hereof from an exterior surface. The above described configuration will enable a non-porous layer with few defects, etc. (for example, a non-porous single crystal silicon layer) to be formed on the first porous layer as well as separation to be preformed at a desired position in the porous layer.

The first porosity is preferably 10% to 30%, more preferably 15% to 25%. In addition the second porosity is preferably 35% to 70%, more preferably 40% to 60%.

As chemical solution for anodic chemical treatment processing, solution containing hydrogen fluoride, solution containing hydrogen fluoride and ethanol, and solution containing hydrogen fluoride and isopropyl alcohol, etc. can be used.

(Forming of Non-porous Layer)

Here, prior to forming a non-porous layer on a porous layer, at least one of steps (I) to (IV) described below can be added. Preferably, a series of steps of (I) to (II), more preferably (I), (II), and (III) or (I), (II), and to (IV), and still more preferably (I), (II), (III) and (IV) may be executed.

(I) Step of Forming Protection Film to Wall Having Pores

A protection film such as an oxide film or nitride film, etc. may be provided in a wall having pores of a porous layer so as to prevent pores from becoming rougher and larger due to heat treatment. For example, heat treatment (200° C. to 700° C., and preferably 300 to 500° C.) is preformed with an atmosphere having oxide nature. At that time, an oxide film, etc. formed on a surface of the porous layer may be removed (for example, its surface is exposed to solution containing HF).

(II) Step of Hydrogen Baking

Prior to forming a non-porous layer on a porous layer, heat treatment at 800° C. to 1200° C. in a deoxidized atmosphere containing hydrogen is preferable as well. The above described heat treatment can seal pores on a porous layer surface to a certain extent, and, in the case where a natural oxide film exists on the porous layer surface, can remove it as well.

(III) Step of Supplying Micro Raw Material

In the case of growing a non-porous layer on a porous layer, in a growth initial stage, preferably, raw material substance of the above described non-porous layer is supplied in a micro quantity and is caused to grow at a low velocity. Such growth promotes original migration on the porous layer surface to enable surfaces of pores to be sealed.

In particular, raw material supply is controlled so as to make growth velocity be not more than 20 nm/min., preferably not more than 10 nm/min., and more preferably not more than 2 nm/min.

(IV) High Temperature Baking Step

Heat treatment is preformed under a treatment temperature higher than in the aforementioned hydrogen baking step and/or micro raw material supply step, and in deoxidized atmosphere containing hydrogen so that the porous layer surface can undergo further sufficient sealing as well as flattening and smoothing.

Forming of a non-porous layer onto a porous layer can be preformed by homo-epitaxial growth or hetero-epitaxial growth. As non-porous layer, Si, Ge, SiGe, SiC, C, GaAs, GaN, AlGaAs, InGaAs, InP, InAs, etc. can be adopted.

(Method to Transfer a Non-porous Layer)

As method to transfer a non-porous layer formed onto a porous layer into a supporting substrate or a film, etc., there are such methods that (A) a multilayer structure available by bonding step undergoes grinding, abrasive machining, etching, or combination thereof so that unnecessary non-porous portion is removed, and thereafter a porous layer which has emerged undergoes etching (etchant: $HF+H_2O_2$ or HF+alcohol, $HF+H_2O_2$+alcohol), etc. to be removed or (B) the above described multilayer structure undergoes separation with a porous layer.

Separation can be preformed by applying tensil force, compressing force, and shearing force, etc. to the above described multilayer structure or spraying a fluid onto a side surface of the above described multilayer structure.

As a fluid to be used, water, an organic solvent such as alcohol, etc., and acid such as fluoric acid and nitric acid, etc., or alkalis such as potassium hydroxide, etc., and others including fluids which operate to implement etching the split regions on a selective basis can be used. Cool fluids with low temperatures and extremely cool liquid can be used.

Moreover, as a fluid, gas such as air, nitrogen gas, carbon dioxide, and rare gas, etc. may be used.

A porous layer, which eventually could remain on the non-porous layer transferred onto a supporting substrate, can be removed by etching or abrasive machining. Surface flattening and smoothing can be planned by heat treatment in a hydrogen atmosphere.

Thus obtained SOI wafer undergoes thin film processing by a method according to the present invention.

Second Example

With reference to FIGS. 4A to 4D, a fabricating method of a silicon film according to another example of the present invention will be described.

Figure 4A:
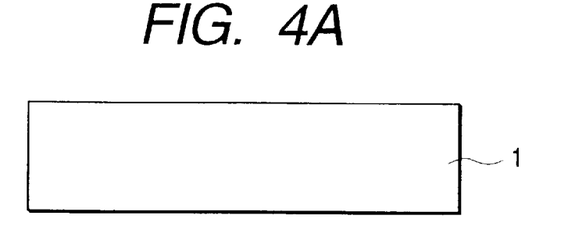
FIGS. 4A, 4B, 4C and 4D are schematic views illustrating a method of producing a silicon thin film in accordance with one form of the present invention.

At first, an 8-inch p-type CZ silicon wafer 1 with specific resistance of 10 Ωcm was prepared as a substrate (FIG. 4A).

Figure 4B:
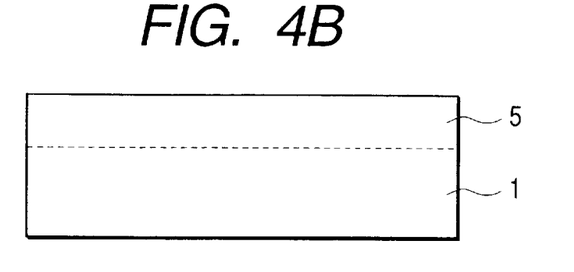

A surface of the wafer was subjected to homo epitaxial growth in a manner of CVD using trichlorosilane ($SiHCl_3$) so that a 10 μm epitaxial layer 5 was formed (FIG. 4B).

Figure 4C:
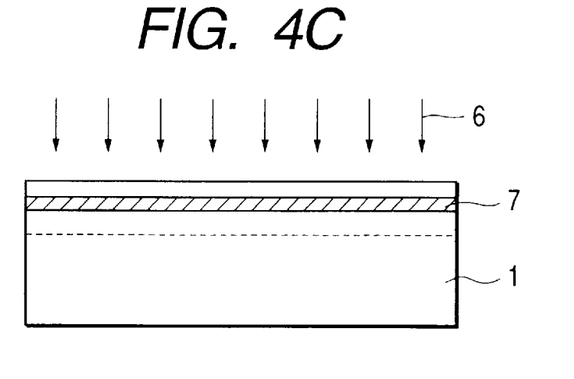

Subsequently, oxygen ions 6 were implanted into the wafer surface in a dose of $2\times10^{18}/cm^2$ at acceleration energy of 180 keV so that a layer 7 which contains oxygen ions at high concentration was formed in a film of an epitaxial layer 5 (FIG. 4C). $O^+$ exemplifies the oxygen ions. An insulating film such as an oxide film may be formed on the surface of the epitaxial layer 5 for the implanting step.

Figure 4D:
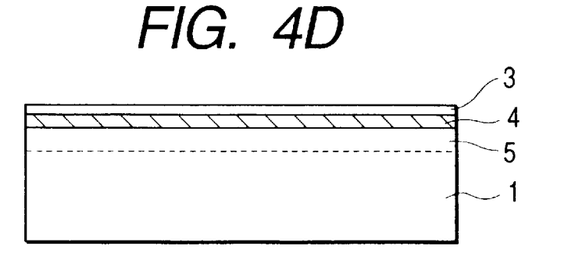

Subsequently, this wafer is disposed in an argon atmosphere to undergo heat treatment at 1350° C. for six hours so that a high concentration oxygen ion containing layer 7 was changed into a silicon oxide layer 4. Thus the SOI layer 3 formed from silicon that was subjected to epitaxial growth was 190 nm thick, and the buried silicon oxide layer 4 was 380 nm thick (FIG. 4D).

This wafer was dipped in SC1 solution having composition as in the first example for 180 minutes for cleaning so that the SOI layer 3 was subjected to thin film processing to 100 nm. Film thickness uniformity of this SOI layer was high, and its surface also was extremely flat and smooth. Incidentally, in order to thicken the buried oxide film, so-called ITOX method may be used.

Third Example

Figure 5A:
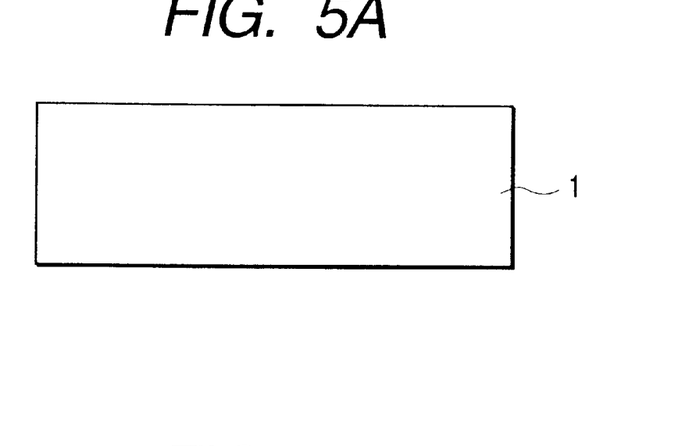
FIGS. 5A, 5B and 5C are schematic views illustrating a method of producing a silicon thin film in accordance with one form of the present invention.
Figure 5B:
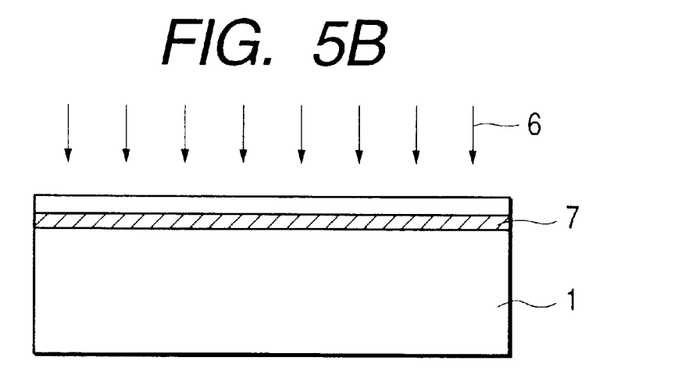
Figure 5C:
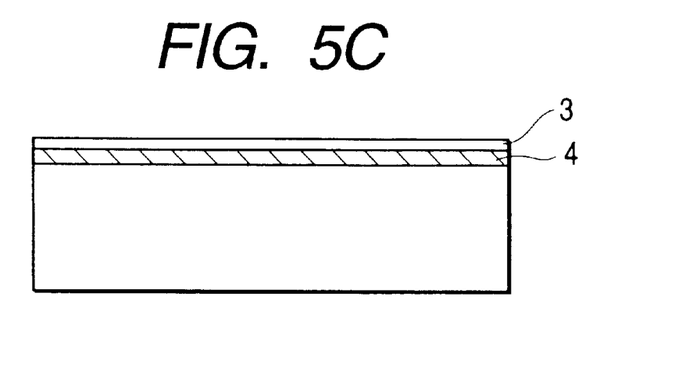

With reference to FIGS. 5A to 5C, a manufacturing method of a silicon film according to another example of the present invention will be described.

At first, as substrate, an 6-inch p-type FZ silicon wafer 1 with specific resistance of 100 Ωcm was prepared (FIG. 5A).

Subsequently, oxygen ions 6 were implanted into this wafer surface in a dose of $2\times10^{18}/cm^2$ at acceleration energy of 180 keV so that a layer 7 containing oxygen ions at high concentration in a portion underneath the surface of the FZ wafer was formed (FIG. 5B).

Under the same conditions as the second example, heat treatment was preformed in an argon atmosphere so that an SOI wafer with a 190 nm thick SOI layer 3 and with a 380 nm thick buried silicon oxide layer 4 was obtained (FIG. 5C).

Subsequently, SOI wafer was dipped in hydrofluoric acid of 5 wt % HF density for a minute so that a natural oxide film on the surface was completely removed and sufficiently rinsed with pure water.

In addition, the above described SOI wafer was dipped in TMAH solution of 2.35 wt % TMAH density available on the market as developer so that the SOI layer 3 was subjected to cleaning at a room temperature for 20 minutes and the 140 nm surface layer of the SOI layer 3 was removed. Etching velocity of silicon with this solution was approximately 7 nm/minute at 25° C. liquid temperature.

Subsequently, with the same SC1 solution as used in the first example, the SOI wafer was subjected to cleaning for five minutes.

This enabled the SOI layer to undergo thin film processing from original 190 nm to 50 nm in shorter time period than in the second example.

Fourth Example

With reference to FIGS. 6A to 6D, a manufacturing method of a silicon film according to another example of the present invention will be described.

Figure 6A:
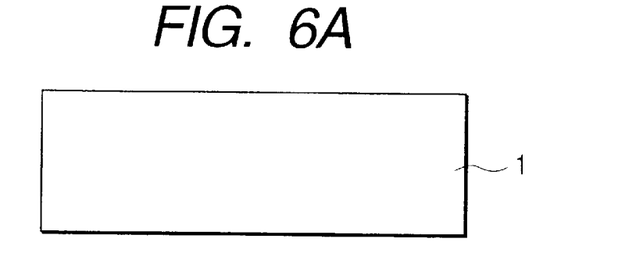
FIGS. 6A, 6B, 6C and 6D are schematic views illustrating a method of producing a silicon thin film in accordance with one form of the present invention.

At first, as substrate, an 8-inch p-type CZ silicon wafer 1 with specific resistance of 10 Ωcm was prepared.

Figure 6B:
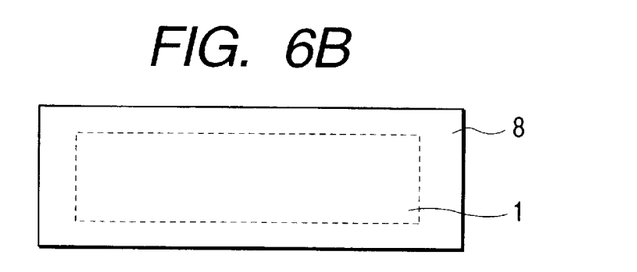
Figure 6C:
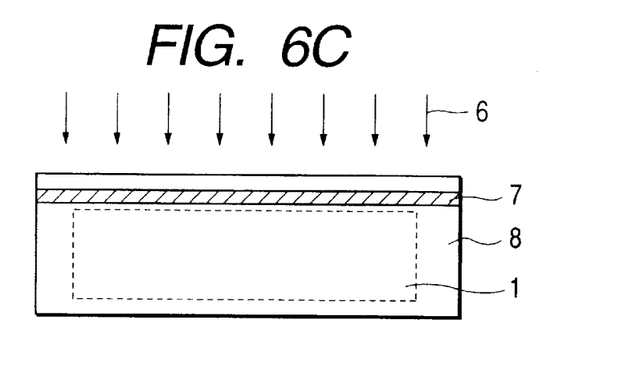
Figure 6D:
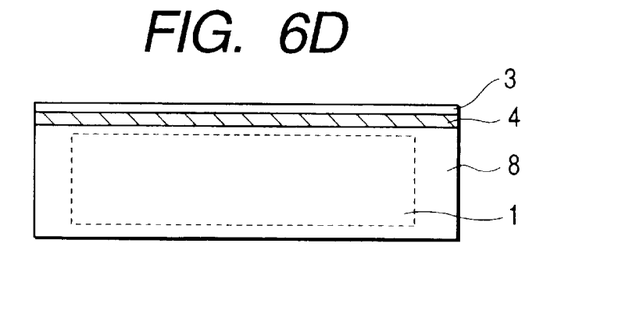

This wafer was put in a hydrogen atmosphere to undergo heat treatment at 1200° C. for six hours so that oxide precipitation in the vicinity of the wafer surface was subjected to deoxidization to form a low oxygen concentration layer 8 in which oxygen concentration was reduced (FIG. 6B).

Hereafter, as in the third example, oxygen ions 6 were implanted to form layer 7 (FIG. 6C), followed by implementing heat treatment so that a buried silicon oxide layer 4 was formed (FIG. 6D), thereafter etching and cleaning was preformed sequentially, and the SOI wafer in the same film thickness configuration as in the third example was obtained. Numeral 3 in FIG. 6D designates a SOI layer.

Fifth Example

With FIGS. 7A to 7G, a fifth example of the present invention will be described.

Figure 7A:
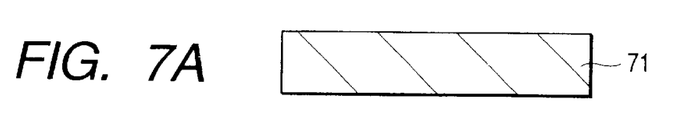
FIGS. 7A, 7B, 7C, 7D, 7E, 7F and 7G are schematic views illustrating a method of producing a silicon thin film in accordance with one form of the present invention.

At first, an 8-inch 10 to 20 Ωcm p-type silicon wafer 71 being a device wafer was prepared (FIG. 7A).

Figure 7B:
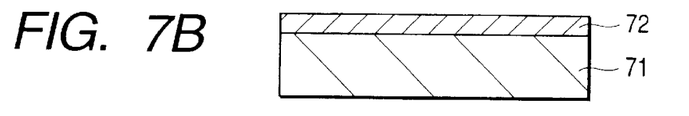

Subsequently, on the surface of the silicon wafer 71 a 5 $\mu$m silicon layer 72 was caused to grow by a normal epitaxial method (FIG. 7B). Incidentally, this epitaxial growth step also can be omitted.

Figure 7C:
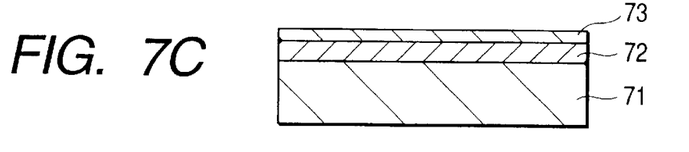

Next, the surface of the epitaxial silicon layer 72 was subjected to heat treatment so that a 400 nm silicon oxide film layer 73 was formed (FIG. 7C). This step of forming the silicon oxide film layer is omissible.

Figure 7D:
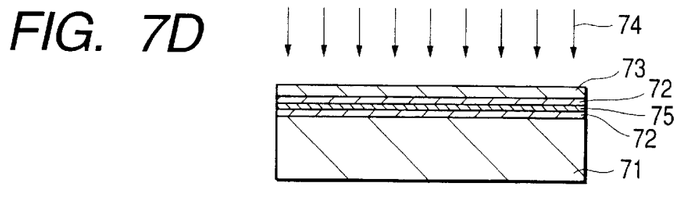

Subsequently with an ion implantation device, hydrogen ions were implanted from the surface of the silicon oxide film layer 73 (FIG. 7D). At this time, energy for implantation and the dose was 100 keV and $2\times10^{15}/cm^2$ respectively. As a result of this, the hydrogen ions reached approximately 800 nm depth from the substrate surface so that an ion implantation layer 75 was formed. It is considered that distortion stress is being applied to the ion implantation layer. Alternatively, the ion implantation layer may be formed in the silicon wafer 71 or in the neighborhood of an interface between the silicon layer 72 and the silicon wafer 71.

Figure 7E:
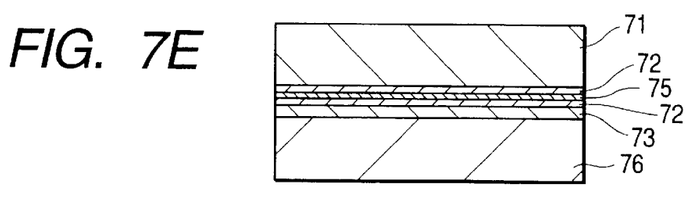

Subsequently, an 8-inch 10 to 20 Ωcm p-type silicon wafer 76 was prepared as a supporting layer so that the surface of the supporting wafer 76 and the surface of the device wafer 71 (the surface of the silicon oxide film layer 73) were mutually bonded subject to cleaning (FIG. 7E). Here, prior to bonding, in order to enhance bonding intensity, each wafer was put in a (not shown) plasma generator to proceed with operation to arrange the surface to be exposed to nitrogen ions. This operation made available bonding intensity in a room temperature approximately five times intensive than in the case of simply cleaning and bonding.

Figure 7F:
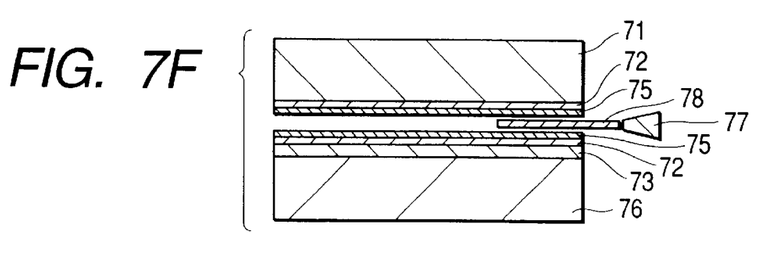

The bonded substrate was subjected to heat treatment at 300° C. for an hour so that the bonding intensity was further intensified and thereafter an air jet nozzle 77 was caused to approach to in the vicinity of the bonded boundary surface and to spray compressed air 78 to it with pressure of 6 kg/cm². As a result thereof, separation took place in the ion implantation layer 75 at the side of the device wafer 71 so that the device wafer 71 side and the supporting wafer 76 side were brought into complete separation at the ion implantation layer 75 (FIG. 7F). Incidentally, the shape of a tip of the air jet nozzle 77 used at this time is a rectangular of 0.1 mm×6 mm in a sectional view and at the time when air was sprayed, the tip of the nozzle was caused to approach for operation a position 1 mm apart from the substrate bonding boundary surface.

Figure 7G:
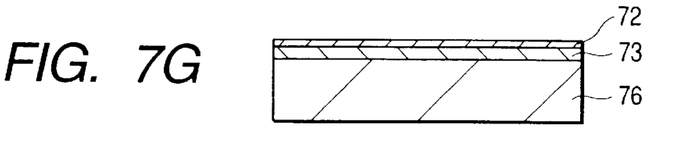

As a result hereof, SOI structure having a 400 nm silicon oxide film layer 73 on supporting wafer 76, thereon an approximately 350 nm epitaxial silicon layer 72, was obtained (FIG. 7G).

Subsequently, the obtained SOI wafer was subjected to hydrogen annealing treatment at 1050° C. for three hours so that the rough surface due to separation was caused to get better in quality to an extremely flat and smooth state.

Lastly, the epitaxial silicon layer (SOI layer) 72 which became flat and smooth was dipped in developer as in the second example to undergo cleaning and film reduction. The developer for use at this time was 2.35 wt % TMAH solution heated to 80° C., cleaning and film reduction was totaled to be 330 nm breaking down to 320 nm by being immersed in this solution for four minutes and moreover 10 nm by being immersed in the same SC-1 solution as used in the first example for 20 minutes. As a result, an SOI wafer having a 70 nm silicon epitaxial layer (SOI layer) 2 and a 400 nm silicon oxide film layer (buried oxide film layer) 3 was completed.

Incidentally, ion implantation seeds for forming separation region are selected from hydrogen and rare gasses such as He, etc.

In addition, for ion implantation technique, beams can be used for implantation. Plasma immersion ion implantation (PIII technique) also can be used.

A fluid to be sprayed may be a gas such as nitrogen and argon, etc. besides air. These issues are described in detail in International Publication Laid-Open No. WO98/52216.

(Method for Manufacturing Semiconductor Device)

With reference to FIGS. 8A to 8D, a semiconductor device using a semiconductor substrate according to each example of the present invention described so far as well as a manufacturing method thereon will be described.

Figure 8A:
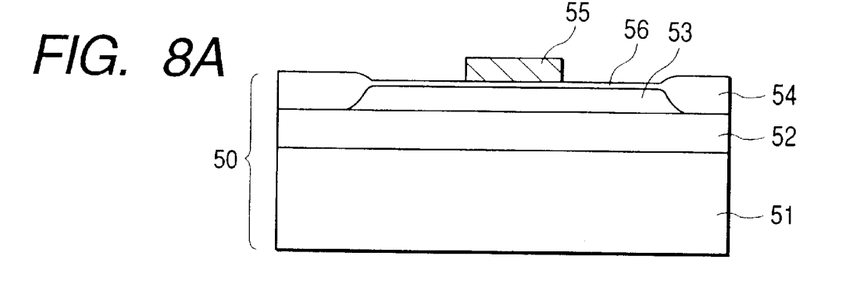
FIGS. 8A, 8B, 8C and 8D are schematic views illustrating a method of producing a semiconductor device using a SOI wafer constructed in accordance with the present invention.

As semiconductor substrate, an SOI wafer 50 formed by means of the present invention described in the above described first example to seventh example, etc. is prepared.

The SOI layer made of non-porous semiconductor on a buried insulating film 52 on the substrate material 51 undergoes patterning into an island shape or LOCOS oxidation so that a pattern 53 of the SOI layer is formed in a region where a transistor should be formed. A set of FIGS. 8A to 8D exemplifies cases wherein element separation region 54 such as an insulator are employed.

A gate insulating film 56 is formed on a surface of SOI layer 53. As silicon gate insulating film 56, silicon oxide, silicon nitride, silicon nitride-oxide, aluminum oxide, tantalum oxide, hafnium oxide, titanium oxide, scandium oxide, yttrium oxide, gadolinium oxide, lanthanum oxide, zirconium oxide, and glass of mixture thereof, etc. is used. The gate insulating film 56 can be formed by oxidizing the surface of the SOI layer 53 or by depositing the material on the surface of SOI layer 53 by CVD and PVD.

On gate insulating film 56 a gate electrode 55 is formed. As gate electrode 55, p-type or n-type multicrystal silicon, metal such as tungsten, molybdenum, titanium, tantalum, aluminum and copper, and an alloy containing at least one kind of them, metal silicide such as molybdenum silicide, tungsten silicide and cobalt silicide, and metal nitride such as titanium nitride, tungsten nitride and tantalum nitride is used. These material layers may undergo lamination comprising a plurality of kinds as in a polycide gate for use. Here, the case where the gate electrode is formed by means of a process referred to as salicide (self align silicide) will be described, but it may be formed by means of a method referred to as damascene gate process.

Thus, a structure as shown in FIG. 8A will be obtained.

Figure 8B:
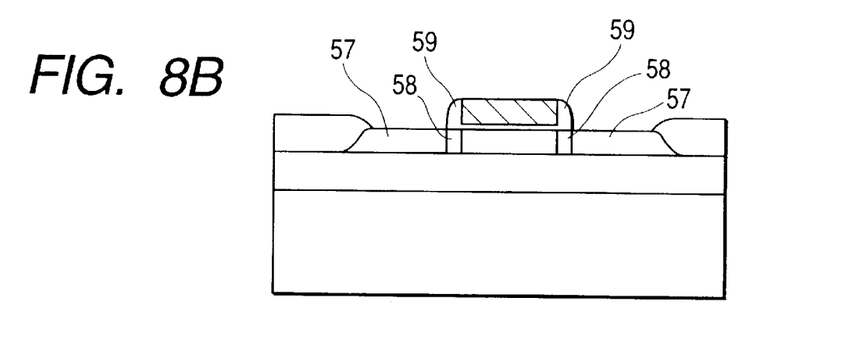

After a pattern of the gate electrode 55 is formed, N-type impurities such as phosphorus, arsenic and antimony, etc. or P-type impurities such as boron, etc. are introduced into the SOI layer 53 so that a comparatively low-concentration source-drain region 58 coherent with the side surface of the gate electrode 55 is formed. The impurities can be introduced by ion implantation and heat treatment, etc.

After an insulating film is formed so as to cover the gate electrode 55, etching back is preformed so that a side wall 59 is formed on a side surface of the gate electrode 55.

Again, the impurities of the same conductive type are introduced so that a comparatively high-concentration source-drain region 57 coherent with the side wall 59 is formed.

Thus a structure shown in FIG. 8B is obtained.

Figure 8C:
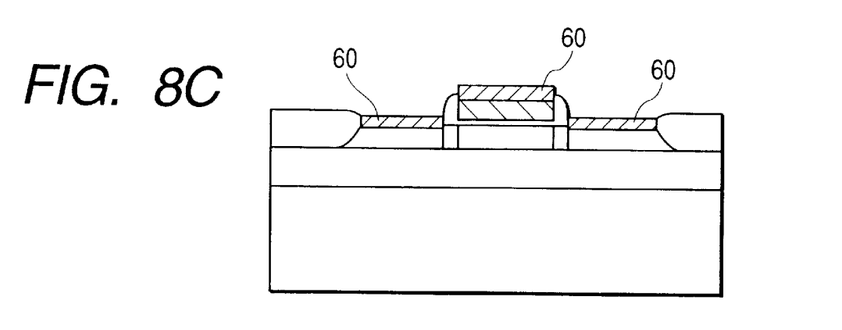

An upper surface of the gate electrode and an upper surface of the source-drain region are exposed, and a metal semiconductor compound layer 60 is formed there. As metal semiconductor compound, metal silicide is preferable, and in particular, nickel silicide, titanium silicide, cobalt silicide, molybdenum silicide and tungsten silicide, etc. is used. Metal is made to deposit on the upper surface of the gate electrodes 55 and on the upper surface of the source-drain region 57 so as to cover it and undergoes heat treatment so as to react with silicon of the source-drain region 57, and afterwards, non-reactive portion of the metal is removed with etchant such as sulfuric acid, etc. so that these kinds of silicide can be formed. Moreover, in order to comply with necessity, a surface of the metal semiconductor compound layer 60 may undergo nitriding.

Thus, a structure shown in FIG. 8C can be obtained.

Figure 8D:
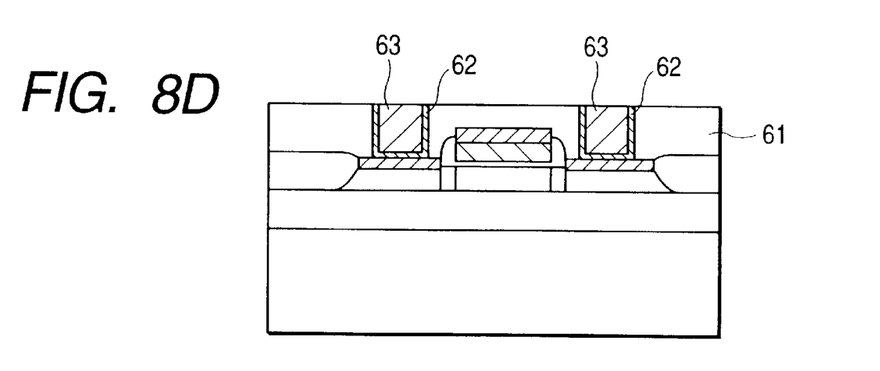

An insulating film 61 is formed so as to cover the upper surface of the gate electrode and the upper surface of the source-drain region that have become silicide. As this insulating film 61, silicon oxide containing phosphorus and/or boron is preferably used.

In order to comply with necessity, the upper surface of the insulating film 61 is flattened by means of etching back or CMP so that contact holes are formed in the insulating film 61. Photolithography adopting KrF excimer laser, ArF excimer laser, F2 excimer laser, electron beam and X-ray as light source is used so that rectangular contact holes having sides smaller than 0.25 µm or circular contact holes having diameters smaller than 0.25 µm can be formed.

A conductor plug is formed inside a contact hole. As method for forming a conductor plug inside a contract hole, at least one layer made of dystetic metal film to become barrier metal 62, metal semiconductor compound or dystetic metal compound is formed, and thereafter, a conductive material such as tungsten, tungsten alloy, aluminum, aluminum alloy, copper and copper alloy is made to deposit by means of CVD, PVD and plating to form portions 63, and in order to comply with necessity, conductive materials existing above the upper surface of the insulating film may be removed by means of etching back or CMP.

Or in order to comply with necessity, after the surface of the silicide layer 60 of the source-drain region 57 that is exposed from the contact hole undergoes nitriding, a conductor may be filled in inside a contact hole.

Thus, a structure (MOS type thin-film transistor) shown in FIG. 8D is obtained.

Thus, utilizing an SOI wafer of the present invention, a semiconductor device such as a transistor can be manufactured.

At this time, if thickness as well as impurities concentration of the SOI layer is determined so that a depletion layer spreading under the gate insulating film reaches the upper surface of the buried insulating film by applying a voltage to the gate electrode, this transistor will operate as a complete depletion type transistor. In addition, if thickness as well as impurities concentration of the SOI layer is determined so that a depletion layer does not reach the upper surface of the buried insulating film, this transistor will operate as a partial depletion type transistor.

In the case where the present invention is used, an SOI layer can undergo a film process, and therefore it will become easy to form a complete depletion type transistor.

According to the present invention, enhanced oxidation in a crystal defect portion that brought about at the time of conventional sacrificial oxidation, surface roughness due to effect of alien substance, and deterioration in pressure resistance of oxide film accompanied by surface roughness, etc. can be avoided. In addition, a heat oxidation step as well as an etching step for a heat oxide film can be omitted. Thus, it will become possible to form an ultra-thin film (not more than 100 nm) SOI wafer, direct production of which used to be difficult so far, having uniform film thickness without roughening its surface.

What is claimed is:

1. A method for producing a silicon thin film provided on an insulating surface, which comprises the steps of:

preparing the silicon thin film at a thickness larger than 100 nm on the insulating surface;

heat-treating the silicon thin film in a reducing atmosphere containing hydrogen; and wet-cleaning the heat-treated silicon thin film to decrease the thickness of the silicon thin film to 100 nm or less.

2. The method for producing a silicon thin film according to claim 1, wherein the thickness of the silicon thin film is decreased to 50 nm or smaller by the wet-cleaning.

3. The method for producing a silicon thin film according to claim 1, wherein the silicon thin film is prepared from an epitaxially grown film.

4. The method for producing a silicon thin film according to claim 1, wherein the silicon thin film is prepared from a hydrogen annealed silicon.

5. The method for producing a silicon thin film according to claim 1, wherein the silicon thin film is prepared from a FZ silicon wafer.

6. The method for producing a silicon thin film according to claim 1, wherein the wet-cleaning is performed using an SC1 aqueous cleaner or an organic alkali solution.

7. The method for producing a silicon thin film according to claim 1, wherein the etch rate by the wet-cleaning is 0.1 nm/min or higher and 10 nm/min or lower.

8. The method for producing a silicon thin film according to claim 1, wherein the silicon thin film is subjected to the wet-cleaning treatment without being subjected to thermal oxidation.

9. The method for producing a silicon thin film according to claim 1, wherein the silicon thin film comprises a silicon thin film in which oxygen content is lower than that of a CZ wafer.

10. The method for producing a silicon thin film according to claim 1, wherein the wet-cleaning is performed using a cleaner containing ammonia and hydrogen peroxide.

11. A method for fabricating a SOI substrate which comprises the steps of:

preparing a substrate having a silicon thin film larger than 100 nm in thickness on an insulating surface;

heat-treating said substrate in a reducing atmosphere containing hydrogen; and wet-cleaning the heat-treated substrate so as to decrease the thickness of said silicon thin film to 100 nm or less.

12. The method for fabricating a SOI substrate according to claim 11, wherein the substrate is prepared by a process which comprises the steps of:

forming a composite member by bonding a first substrate comprising a porous layer and a silicon thin film formed thereon to a second substrate via an insulating layer; and separating said composite member by the porous layer.

13. The method for fabricating a SOI substrate according to claim 11, wherein the substrate is prepared by a process comprising the steps of:

forming a composite member by bonding a first substrate, which comprises an ion implanted layer and a silicon thin film formed thereon, to a second substrate via an insulating layer; and separating said composite member at the ion implanted layer.

14. The method for fabricating a SOI substrate according to claim 13, wherein the first substrate is formed by a process comprising a step of implanting hydrogen ions in the given regions of a silicon wafer.

15. The method for fabricating a SOI substrate according to claim 11, wherein the substrate is prepared by a process which comprises the step of implanting oxygen ions into a silicon wafer.

16. The method for fabricating a SOI substrate according to claim 11, wherein the thickness of the silicon thin film is decreased to 50 mn or smaller by the wet-cleaning.

17. A method for producing a semiconductor device comprising a step of forming an active region of transistor in the silicon thin film according to claim 11.

* * * * *

UNITED STATES PATENT AND TRADEMARK OFFICE
CERTIFICATE OF CORRECTION

PATENT NO. : 6,653,209 B1
DATED : November 25, 2003
INVENTOR(S) : Kenji Yamagata It is certified that error appears in the above-identified patent and that said Letters Patent is hereby corrected as shown below:

<u>Column 8,</u>
Line 10, "t he" should read -- the --.

<u>Column 16,</u>
Line 13, "mn" should read -- nm --.

Signed and Sealed this

Sixth Day of July, 2004

JON W. DUDAS
*Acting Director of the United States Patent and Trademark Office*